(12) United States Patent
Hamer

(10) Patent No.: US 7,301,739 B2
(45) Date of Patent: Nov. 27, 2007

(54) GROUND-FAULT CIRCUIT-INTERRUPTER SYSTEM FOR THREE-PHASE ELECTRICAL POWER SYSTEMS

(75) Inventor: Paul S. Hamer, San Ramon, CA (US)

(73) Assignee: Chevron U.S.A. Inc., San Ramon, CA (US)

( * ) Notice: Subject to any disclaimer, the term of this patent is extended or adjusted under 35 U.S.C. 154(b) by 241 days.

(21) Appl. No.: 11/250,115

(22) Filed: Oct. 12, 2005

(65) Prior Publication Data

US 2007/0081281 A1 Apr. 12, 2007

(51) Int. Cl.
*H02H 3/00* (2006.01)
(52) U.S. Cl. .................................................. 361/42
(58) Field of Classification Search .................. 361/42, 361/44, 47, 62, 63, 66
See application file for complete search history.

(56) References Cited

U.S. PATENT DOCUMENTS

| | | | |
|---|---|---|---|
| 3,840,783 A * | 10/1974 | Eckart | 361/47 |
| 4,138,707 A | 2/1979 | Gross | |
| 4,156,884 A | 5/1979 | Eckart et al. | |
| 4,205,358 A | 5/1980 | Washington | |
| RE30,304 E | 6/1980 | Eckart | |
| 4,685,022 A | 8/1987 | Nichols, III et al. | |
| 5,629,825 A * | 5/1997 | Wallis et al. | 361/64 |
| 5,786,971 A | 7/1998 | Chan et al. | |
| 5,793,587 A | 8/1998 | Boteler | |
| 6,459,269 B1 | 10/2002 | Jones | |
| 6,671,150 B2 | 12/2003 | Elms et al. | |
| 6,731,482 B2 | 5/2004 | Juncu | |
| 7,117,105 B2 * | 10/2006 | Premerlani et al. | 702/58 |
| 7,180,300 B2 * | 2/2007 | Premeriani et al. | 324/512 |

OTHER PUBLICATIONS

Bender Product Brochure "Ground Fault Location in AC & DC Systems Made Easy with Bender Eds and RCMS systems", no date avalable.

* cited by examiner

*Primary Examiner*—Michael Sherry
*Assistant Examiner*—Boris Benenson
(74) *Attorney, Agent, or Firm*—Buchanan Ingersoll & Rooney PC

(57) ABSTRACT

A ground-fault circuit-interrupter method and system for three-phase electrical power systems including a plurality of GFCI units and a processor forming a ground-fault circuit interrupting system for use in a three-phase power distribution network including a three-phase source of electrical power, a three- or four-wire main circuit, and a plurality of three- or four-wire feeder circuits connected across the main circuit. A GFCI unit is provided in the main circuit and in each of the feeder circuits. The processor is programmed to continuously monitor the main GFCI unit and each feeder GFCI unit to determine when and where a fault has occurred and, in response thereto, to interrupt the faulted circuit and to inhibit tripping of the non-faulted circuits. The novel GFCI system is applicable for solidly-grounded, resistance-grounded, or ungrounded as well as other three-phase systems.

24 Claims, 7 Drawing Sheets

GROUND-FAULT CIRCUIT-INTERRUPTER SYSTEM FOR THREE-PHASE ELECTRICAL POWER SYSTEMS

BACKGROUND

1. Field of the Invention

The present invention relates generally to Ground-Fault Circuit-Interrupter (GFCI) systems, and more particularly to a new and improved GFCI system for alternating current, separately derived, three-phase electrical power systems wherein means are provided for continuously monitoring the current balance conditions on the main power supply bus supply lines and on each feeder circuit connected thereto, and in the event that a fault condition is determined to exist based on certain relationships between the sensed currents in the main bus supply lines and the sensed currents in any feeder circuit, then the faulted circuit will be tripped and the other circuits will be inhibited from tripping.

2. Discussion of the Prior Art

Prior art ground-fault protective systems are intended to sense small differences in current in power conductors that normally carry balanced currents. Such differences may be caused by leakages of current from one of the line conductors to ground, thus depriving the neutral conductor of some of the normal current that would establish a balance, or zero difference, in current in the conductors at a sensor. If the differential currents are below certain predetermined levels, power is normally allowed to flow uninterrupted. However, if differential currents should occur that exceed a predetermined threshold for a long enough time, the circuit is interrupted, since it is then probable that an incipient failure of insulation or perhaps even a serious shock to a human being is occurring.

Spurious signals often cause ground-fault interrupters to be confused with real fault currents. For example, power line transients caused by sudden load changes, or lightning induced surges, can give rise to unnecessary line tripping in ground-fault interrupter systems. Since such disconnections of the circuits interfere with efficient system operation, it is not unusual to find that intolerance thereto has caused the users of such equipment to establish sensitivity specifications at dangerously high levels. A steady-state spurious signal frequently experienced in three-phase electrical power systems is a capacitive current to ground from at least one of several downstream feeder lines. This can be caused by a long cable to a load, or by discrete phase-to-ground connected capacitors such as those used to avoid damage to load-utilization equipment by power system voltage surges, or by similar circuit influences having nothing to do with a true fault on the line. It can thus be said that interruptions of the circuit brought about by a ground-fault detector and interrupter system for causes that prove to be insufficient, yet cause the system to respond by needlessly breaking the circuit without the occurrence of a true fault, are a nuisance and must be avoided. A true ground-fault can have different causes and can give rise to different levels of current imbalance in the supply conductors. If the current imbalance is comparatively high; that is to say, if a comparatively large ground-fault current flows, the system should respond quickly and decisively.

Modern GFCI technology has limited application for systems operating above 125 volts line-to-ground or 250 volts line-to-line. Conventional GFCI applications are principally applied to single-phase, 120-240 volt power systems. When the system is a three-phase, multiple feeder circuit system operating above 125 volts-to-ground (e.g., systems rated 400 or 480 volts phase-to-phase, which have a normal voltage-to-ground of 230 and 277 volts, respectively), and one phase is faulted to ground, the magnitude of the capacitive charging currents on the unfaulted phases of the non-affected feeders can easily reach a magnitude that will "false trip" the non-affected feeders' GFCIs. This is not a common problem on systems rated below 125 volts to ground (e.g., a 240-120 volt single-phase system or a 208Y/120 volt three-phase system), because it takes an exceptionally long feeder circuit (with a circuit conductor length of approximately 1000 feet) to result in a capacitive charging current above the GFCI trip level of 4 to 6 mA.

A common voltage used for lighting circuits in the United States is 277 volts phase-to-ground (or phase-to-neutral), which is the voltage to ground or neutral that exists for all three-phase electrical systems rated 480 volts phase-to-phase (except unusual "corner grounded" systems). In a typical situation involving possible electrocution of an individual completing a ground-fault circuit through his body, death does not occur instantaneously, but results most often from ventricular fibrillation. The higher the electrocuting current, the shorter the time in which ventricular fibrillation occurs. Using the 95th percentile human body resistance at 1000 volts (reference IEC TS 60479-1, Fourth Edition, July 2005) yields a "dry" hand-to-hand resistance of 1050 ohms and a dry hand-to-foot resistance of 945 ohms. As an example, the lowest resistance, a dry hand-to-foot resistance of 945 ohms, can be used in a sample calculation for a 690 volt system. At a lower voltage of 225 volts, the dry hand-to-hand resistance is 1900 ohms and the dry hand-to-foot resistance is approximately 1710 ohms. Using these resistances, a hand-to-hand resistance is 1900 ohms corresponds to a body current flow of 146 milliamperes (mA) at a voltage of 277 volts. The hand-to-foot resistance of 1710 ohms corresponds to a body current flow of 162 mA at a voltage of 277 volts. Either of these illustrated levels of current flow are significantly above the threshold of 6 mA where a person can voluntarily "let go" of, or release, a grasped energized conductor. In fact, these magnitudes of current can result in ventricular fibrillation of the heart if the current flow persists through the body for more than approximately one second. In fact, many of the electrocution deaths experienced today are at the 277 volt level.

Ventricular fibrillation is thus considered to be the main mechanism of death in fatal electrical accidents. Ventricular fibrillation results from shock currents through the heart in excess of approximately 40 mA. A published (IEC TS 60479-1, Fourth Edition, July 2005, FIG. 20) time-current plot for various time duration exposures of current flow though the body (for current flow ranging from approximately 40 mA to 1500 mA), depicts a set of probability curves (ranging from a "threshold risk" up to 50% probability) for experiencing ventricular fibrillation. As suggested above, the duration of the shock is a key factor. According to IEC TS 60479-1, "For shock durations below 0.1 s, fibrillation may occur for current magnitudes above 500 mA, and is likely to occur for current magnitudes in the order of several amperes only if the shock falls within the vulnerable period. For shocks of such intensities and durations longer than one cardiac cycle, reversible cardiac arrest may be caused." Additionally, "The vulnerable period occurs during the first part of the T-wave in the electrocardiogram, which is approximately 10% of the cardiac cycle . . . ." A shock will not necessarily result in an electrocution for body currents of up to several amperes if the voltage source is removed quickly enough. The faster the voltage source is removed from a person, the less likely ventricular fibrillation will occur. Ventricular fibrillation often leads to death unless prompt medical intervention is initiated (i.e., CPR, followed by defibrillation)

The International Electrotechnical Commission (IEC) "$c_1$" empirical curve for the threshold 5% probability of ventricular fibrillation for a left-hand-to-foot shock (heart current factor of 1.0) can be expressed by the equation:

$$t(I)=0.2[(500-I)/(I-40)]^{0.5}$$

where:

t=time in seconds, and

I=current in milliamperes (mA)

Calculations pursuant to this equation indicate that a GFCI device must clear 400 mA of current within 0.1 second to avoid ventricular fibrillation for the "worst case" of a shock from the left hand to a foot.

For a 690 volt three-phase system (maximum voltage of 720 volts phase-to-phase):

$$I_{body} = (720/1.732)/945$$
$$= 0.440 \text{ A, or} \sim 440 \text{ mA}$$

One fact that has inhibited the application of GFCIs on voltages greater than 125 volts line-to-ground, or on three-phase systems, is that, as pointed out above, all feeder circuit conductors on such power systems have a characteristic capacitance-to-ground. This is referred to as "system charging current" and is described below. The normal system charging current present on all such systems can often exceed the nominal 6 mA threshold of GFCI devices and result in the nuisance tripping of GFCI protected circuits that are not actually involved in the circuit that has a ground-fault.

Referring now to FIG. 1 of the drawing, a three-phase source S is shown coupled via main phase lines A, B, C to a pair of loads LOAD1 and LOAD2 through feeder lines A', B', C' and A", B" C", respectively. This circuit represents a Prior Art GFCI application in which separate multiple GFCI units, such as the depicted units GFSI1 and GFSI2, are used as protective mechanisms in the respective feeder circuits. Shown in dashed lines are capacitive symbols "$C_0$" representing the distributed capacitances-to-ground for each feeder line. The system charging current "$I_C$" for the feeder circuit to LOAD1 can be calculated from the per-phase capacitance-to-ground values using the following equations:

$$I_C=3I_{CO}=\sqrt{3}V_{LL}/X_{co}$$

$$X_{co}=(10^6)/2\pi f C_o$$

where $I_C$=System charging current during a ground-fault, in amperes;

$I_{CO}$=System charging current of each phase during normal system conditions (no ground-fault), in amperes [$I_{CO}$];

$V_{LL}$=System line-to-line voltage, in volts;

$X_{CO}$=Per-phase capacitive reactance, in ohms [$X_{CO}$];

f=Frequency, in Hertz; and $C_O$=Per-phase capacitance-to-ground, in microfarads.

Using the above equations for a 13 mA system charging current ($I_C$) at 480 volts (typical for a three-conductor insulated cable circuit in metallic conduit of a 1000 ft length) yields:

$$X_{co} = 1.732(480)/0.013$$
$$= 64,000 \text{ ohms per phase for a 1000 ft long feeder cable}$$

From the prior calculation of "body resistance," it will be apparent that when a person touches an energized electrical phase conductor, it is equivalent to putting a resistor in the order of 1050 ohms in parallel with a −j64,000 ohm capacitive reactance $X_{CO}$, except that the capacitance is distributed along the entire cable leading to the source, and most of the current will take the more direct path through the body resistance. (Note: $R_N$ in FIG. 1 is the system's neutral grounding resistor and can vary from zero resistance for a solidly-grounded system, to a few hundred ohms for a high-resistance grounded system, to an infinite value for an ungrounded system.

In the illustrated example, a fault in any of the feeder lines to LOAD1 will be sensed by GFCI1. Note that as depicted, GFCI1 includes a circuit breaker CB1 and a ground-fault sensor detection device GFS1 that is coupled to an overall core-balance, current transformer CT1 that encircles all three phases A', B' and C' (as well as the neutral for a three-phase, four-wire system if used). Each of the capacitive charging currents in the three-phase load conductors (and neutral) sum to zero for a balanced or unbalanced load condition. Under normal system operating conditions, the capacitive charging currents $I_{CO}$ in all three phases are equal and sum to zero.

In this example, the fault current induced on the multi-turn secondary winding W1 of CT1 is proportional to the vectorial sum of the capacitive charging currents flowing in the three line conductors A', B', C'. As long as this sum is below a predetermined threshold value (typically 4 to 6 mA), the net flux induced in the core of CT1 and correspondingly, the fault current induced on its multi-turn secondary winding W1 and coupled into GFS1 will be beneath the trip threshold thereof.

In the absence of an induced fault current in winding W1 exceeding the threshold level, the differential current transformer remains correspondingly "balanced", and circuit breaker CB1 is held in its closed state. However, should a fault to ground occur, such as is shown at "F" in FIG. 1, where line A' is shorted to ground, the vectorial sum of the capacitive charging currents in lines A', B', C' will no longer be less than the threshold value, and the corresponding fault current induced in the secondary winding W1 will cause the differential transformer of GFS1 to become unbalanced, and trip circuit breaker CB1 to interrupt the feeder circuit to LOAD1 and clear the ground-fault F.

But in addition, as may be further noted in FIG. 1, and as will be further discussed below, during the fault, the unbalanced voltages that exist with respect to ground also force current flow (currents $I_{b2}$ and $I_{c2}$) in phases B" and C" of the feeder circuit to LOAD2 (and any other feeder circuits in the system driven by source S). These two currents can result in a false trip of the non-faulted feeder circuit if the resulting unbalance causes the generation of a fault current in W2 that exceeds the trip threshold of GFS2. This of course causes an unnecessary "nuisance" trip and should be avoided.

There is thus a need for a GFCI system for three-phase applications principally operating at voltages above 125 volts and having a ground-fault pickup sensitivity of 4 to 6 mA (corresponding to the lower limit of the human "let-go" threshold of current), and which will trip within several seconds of a ground-fault in excess of a current level of 6 mA, or within 0.025 to 0.100 second for ground-fault current in excess of 20 mA to 30 mA.

Furthermore, there is a need for a GFCI system that will quickly determine which line has been faulted and will interrupt the feeder circuit including that line without interfering with the operation of other feeder circuits in the system.

In addition to the advantages of the GFCI system described above to avoid fatal shocks, incipient failure of electrical insulation can also be detected at a current sensitivity of 6 to 30 mA, which can minimize equipment damage.

SUMMARY

It is therefore an object of the present invention to provide an improved ground-fault circuit-interrupter system capable of quickly detecting and eliminating a system fault without causing nuisance interruptions to non-faulted circuits of the monitored power supply system.

Another objective of the present invention is to provide a means to compensate for the small capacitive currents that flow throughout a three-phase power system during a low-or high-level ground-fault and to thereby avoid nuisance tripping of the non-faulted circuits.

Still another objective of the present invention is to provide a GFCI system for three-phase power supply systems which makes an immediate determination of where within the system the fault resides and causes immediate interruption of the faulted lines while inhibiting interruption of other lines within the system.

Briefly, a presently preferred embodiment of the present invention includes a plurality of GFCI units and a controller forming a ground-fault circuit interrupting system for use in a three-phase power distribution network including a three-phase source of electrical power, a three- or four-wire main circuit and a plurality of three- or four-wire feeder circuits connected across the main circuit. A GFCI unit is provided in the main circuit and in each of the feeder circuits. The controller continuously monitors the main GFCI unit and each feeder GFCI unit to determine when and where a fault has occurred and, in response thereto, interrupts the faulted circuit and inhibits tripping of the non-faulted circuits. The novel GFCI system is applicable for solidly-grounded, resistance-grounded, or ungrounded as well as other three-phase systems.

An important advantage of the present invention is that it provides a GFCI system that can immediately disconnect power from a faulted feeder circuit without causing the interruption of the other "healthy" feeder circuits.

Another advantage of the present invention is that it provides a GFCI system that can immediately detect a fault, determine the source of the fault, interrupt the faulted circuit and prevent the interruption of any non-faulted circuits.

These and other objects and advantages of the present invention will no doubt become apparent to those skilled in the art after reading the following detailed description which makes reference to the several figures of the drawing.

IN THE DRAWING

DETAILED DESCRIPTION

A premise upon which the present invention is based is that, while workers should always exercise safe work practices, i.e., by de-energizing and "locking out" the circuit to be worked on, and "testing before touching" the circuit in order to avoid the shock hazard, a mistake or oversight should not result in a fatality. However, OSHA accident reports documenting dozens of 277 volt fatalities dating back to 1990 indicate that inadvertent contact with energized parts has happened far too often on the higher voltage systems.

In the case of an accidental fault in a 480Y/277 volt system, the shock current though a person's body to ground can be calculated to be in the range of 220 mA to 400 mA. For example, using the "50% of the population" hand-to-hand body impedance at 400 volts listed on Table 1 of IEC TS 60479-1, the current will be 277 volts/950 ohms=0.29 amperes, or 290 mA. As discussed above, the probable reason there are so many fatalities involving the 480 volt systems (277 volts to ground) is that a person cannot voluntarily let go when he or she grasps an exposed live wire or other "energized" part. This is a serious consequence since in order to avoid ventricular fibrillation of the heart, the source of shock voltage must be removed from the person within approximately 0.3 to 0.6 second of the shock initiation for a shock current magnitude of 290 mA.

The thesis of the present invention is that among several feeder circuits sharing a single three-phase power source, the circuit experiencing the highest detectable ground-fault current will be the faulted circuit. It is envisioned that determination of which circuit has the highest magnitude of sensed ground-fault current (above the trip threshold) can be determined by continuously monitoring the GFCI units respectively associated with the main circuit and the several feeder circuits and determining which unit has the highest ground-fault current. A computer simulation of various ground-fault scenarios has confirmed this theory.

Figure 1:
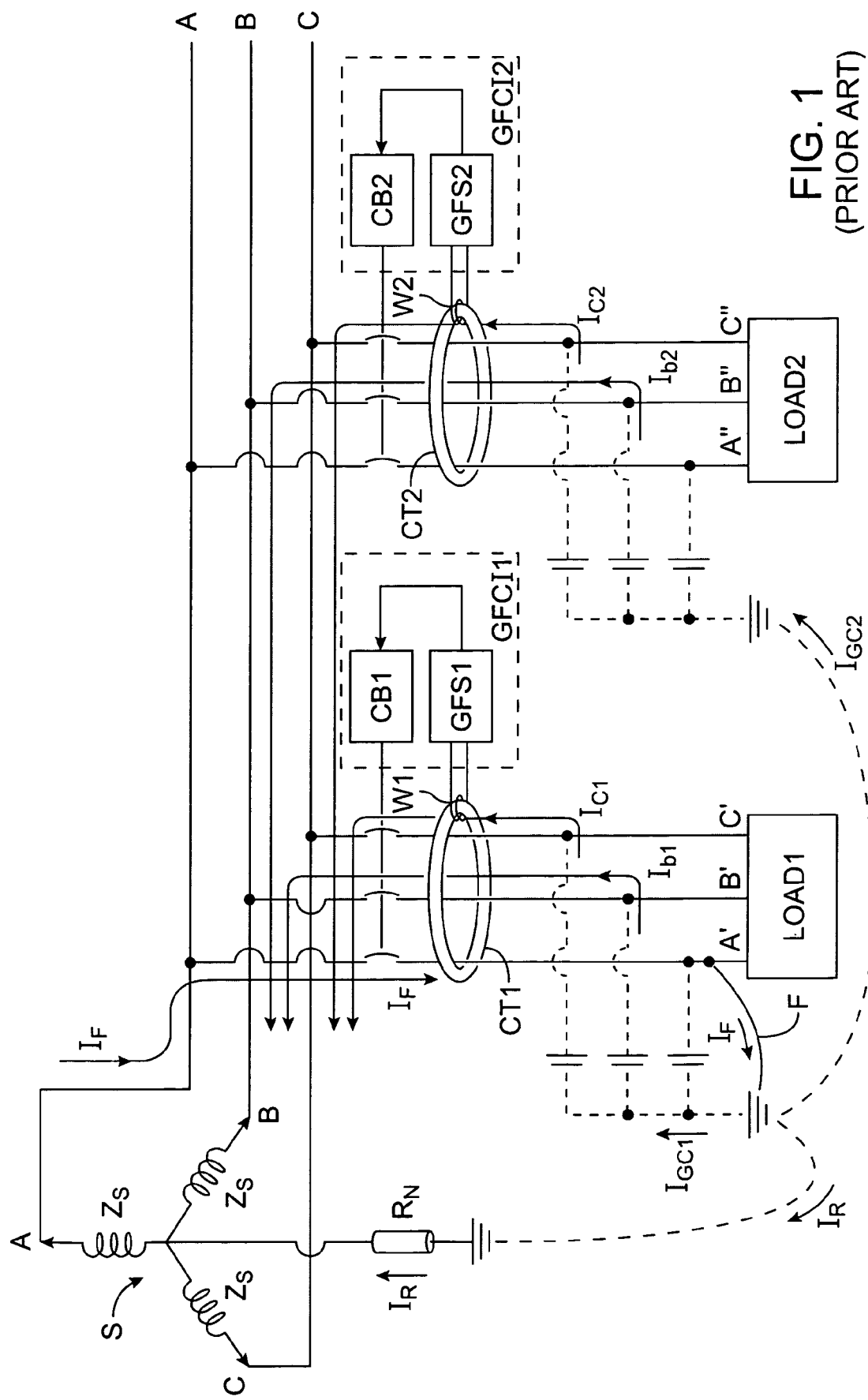
FIG. 1 is a schematic circuit diagram illustrating a prior art three-phase circuit having a GFCI unit.
Figure 1A:
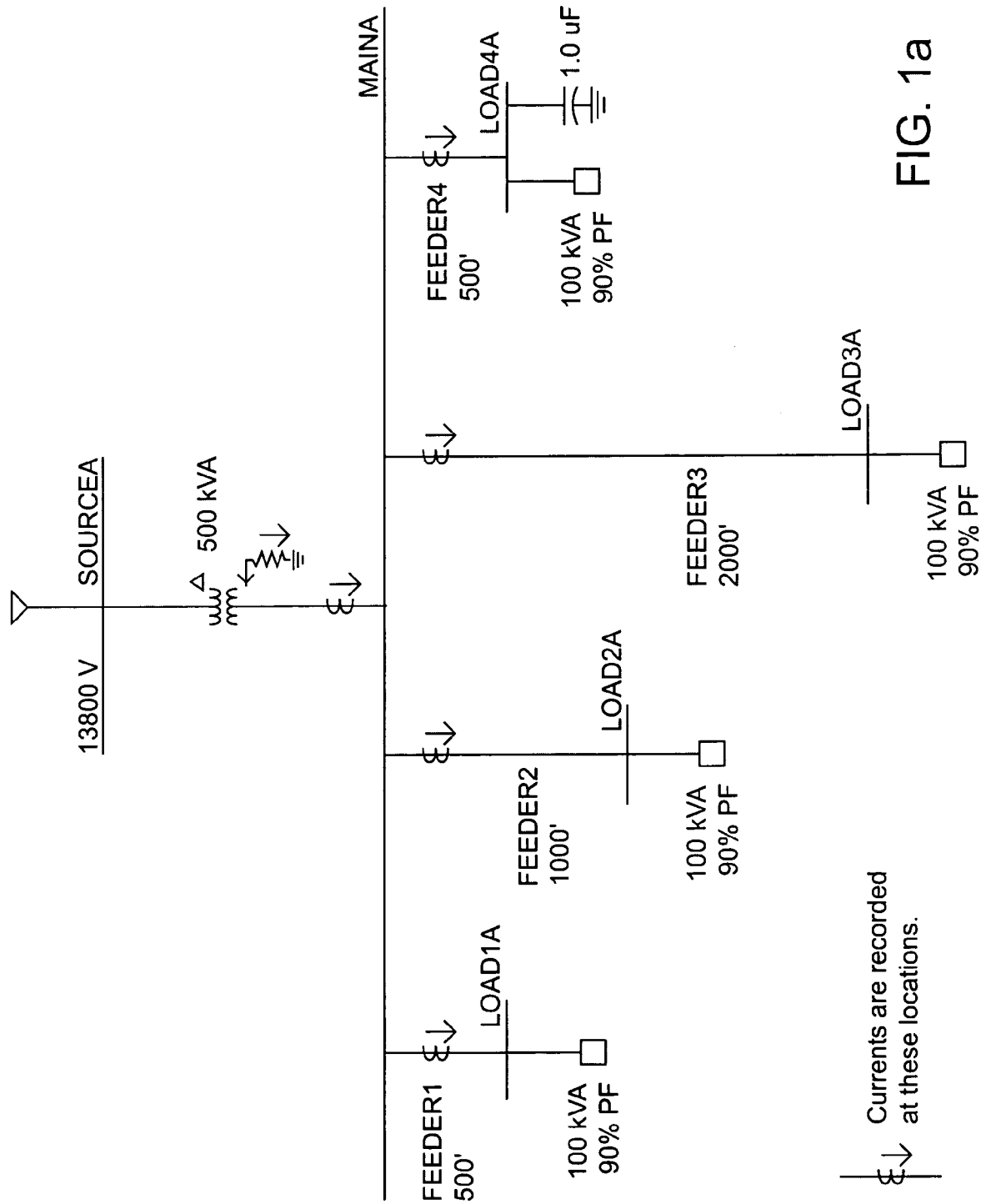
FIG. 1a is a one-line diagram of the V-Harm simulation and the assumed parameters for the system used to develop the Tables shown in the text hereof.

More specifically, a computer program called "V-Harm" was used to simulate and predict the performance of the ground-fault system for various scenarios. V-Harm is a load flow computer program that represents each phase of the three-phase system separately, and calculates the system currents for unbalanced load or fault conditions, such as faults from phase to ground. FIG. 1a depicts a one-line diagram of the V-Harm simulation and the assumed parameters for the system used to develop the Tables shown below.

Three representative types of three-phase power systems were simulated, solidly-grounded, high-resistance grounded, and ungrounded. Three degrees of fault resistance were simulated for each type of system: zero ohms to represent the extreme of a solid "bolted" fault, 700 ohms to represent the average resistance of a person's body at the 480-volt system voltage, and 46,000 ohms to represent the 6 mA protective threshold current level at 277 volts-to-ground.

---

DATA

Frequency = 60 Hz
Source Impedance at 13.8 kV = 0 Ohms
Transformer
    500 kVA
    13.8 kV/480 V
    Delta/Wye (The grounding at the wye is varied in the analysis.)
    X = 5.75%
    R = 1.44%
480 V Feeder (These parameters are estimated based on a three-phase, three-wire system with 2/0 copper conductors in steel conduit. There is no neutral except for the Series III cases. A 2/0 copper equipment grounding conductor is run with all the feeder circuits.)
    $Z_1$ = 0.1020 + j0.0533 ohms/1000'
    $Z_0$ = 0.3214 + j0.1002 ohms/1000'
    $C_1$ = 70 nf/1000'
    $C_0$ = 40 nf/1000'
Loads (The loads are connected in an ungrounded-wye configuration for the Series I & II cases. In the Series III cases, the neutral of each load is connected to its neutral conductor.)
    Series I & II
        Feeder 1 - balanced three-phase 90 kW, 0.9 pf
        Feeder 2 - balanced three-phase 90 kW, 0.9 pf
        Feeder 3 - balanced three-phase 90 kW, 0.9 pf
        Feeder 4 - balanced three-phase 90 kW, 0.9 pf
            with a 1.0 uf surge capacitor connected
            from each phase-to-ground
    Series III
        Feeder 1 - Phase A-N - 30 kW, 0.90 pf
            Phase B-N - 20 kW, 0.85 pf
            Phase C-N - 10 kW, 0.80 pf
        Feeder 2 - Phase A-N - 15 kW, 0.90 pf
            Phase B-N - 35 kW, 0.85 pf
            Phase C-N - 25 kW, 0.80 pf
        Feeder 3 - Phase A-N - 20 kW, 0.90 pf
            Phase B-N - 20 kW, 0.85 pf
            Phase C-N - 30 kW, 0.80 pf
        Feeder 4 - Is Disconnected

---

Examining Tables 1 and 4 (for a solidly grounded system) and Tables 2 and 5 (for a high- resistance grounded system), it can be concluded that in every case that a ground-fault does not involve the main bus, the faulted feeder is the one that has the highest sensed ground-fault current.

Tables 3 and 6 (for an ungrounded system) illustrate that the faulted feeder always has the highest sensed ground-fault current, but the discrimination between some of the other feeders (depending on the particular feeder's charging capacitance and the resistance or impedance of the ground-fault itself) is not as great as with the solidly-and resistance-grounded systems.

Table 7 illustrates that unbalanced phase-to-neutral loads have no affect on the sensed ground-fault currents, if the sensor current transformer encloses the phase and neutral conductors.

TABLE 1

("Series I" Case-system with load on feeders)
Summary Table of Fault Current (shaded blocks) and Current Distribution-
Solidly Grounded 480 Volt System;
Ground-Fault at "Far End" of Feeders
90 kW Ungrounded Balanced Load on All Feeders
Feeder 4 with 1.0 μF Surge Capacitor Connected on Far End to Ground
(Current in milliamperes as sensed by a core-balance or differential current transformer, unless shown otherwise)

|  | Main | Fdr 1 | Fdr 2 | Fdr 3 | Fdr 4 |
|---|---|---|---|---|---|
| Phase-Ground Fault on Main Bus |  |  |  |  |  |
| Solid ground fault | 10.1kA | 2 | 4 | <u>8</u> | <u>108</u> |
| 700 ohm ground fault | 384 | 0 | 0 | 0 | 0 |
| 46,000 ohm ground fault | 4 | 0 | 0 | 0 | 1 |
| Phase-Ground Fault of Feeder 1 |  |  |  |  |  |
| Solid ground fault | <u>2.4kA</u> | 2.4kA | 1 | 2 | <u>25</u> |
| 700 ohm ground fault | <u>375</u> | 375 | 0 | 0 | 0 |
| 46,000 ohm ground fault | <u>6</u> | 6 | 0 | 0 | 1 |
| Phase-Ground Fault on Feeder 2 |  |  |  |  |  |
| Solid Ground fault | <u>1.3kA</u> | 1 | 1.3kA | 1 | <u>14</u> |
| 700 ohm ground fault | <u>366</u> | 0 | 366 | 0 | 1 |
| 46,000 ohm ground fault | <u>6</u> | 1 | 6 | 0 | 1 |
| Phase-Ground Fault on Feeder 3 |  |  |  |  |  |
| Solid ground fault | <u>0.65kA</u> | 1 | 1 | 0.65kA | <u>7</u> |
| 700 ohm ground fault | <u>348</u> | 0 | 0 | 348 | 1 |
| 46,000 ohm ground fault | <u>5</u> | 0 | 0 | 5 | 0 |
| Phase-Ground Fault on Feeder 4 |  |  |  |  |  |
| Solid grround fault | <u>2.4kA</u> | 1 | 1 | 2 | 2.4kA |
| 700 ohm ground fault | <u>372</u> | 1 | 0 | 0 | 375 |
| 46,000 ohm ground fault | 4 | 0 | 0 | 0 | 6 |

Note: Underlined currents on the non-faulted circuits represent a sensed current at or above a 5 mA protective threshold level.

TABLE 2

("Series I" Case-system with load on feeders)
Summary Table of Fault Current (shaded blocks) and Current Distribution-
High-Resistance Grounded 480 Volt System;
Ground-Fault at "Far End" of Feeders;
90 kW Ungrounded Balanced Load on All Feeders;
Feeder 4 with 1.0 μF Surge Capacitor Connected on Far End to Ground
(Current in milliamperes as sensed by a core-balance or differential current transformer, unless shown otherwise)

|  | Main | Fdr 1 | Fdr 2 | Fdr 3 | Fdr 4 |
|---|---|---|---|---|---|
| Phase-Ground Fault on Main Bus |  |  |  |  |  |
| Solid ground fault |  | <u>6</u> | <u>12</u> | <u>24</u> | <u>311</u> |
| 700 ohm ground fault | 1981 | 1 | 2 | 4 | <u>50</u> |
| 46,000 ohm ground fault | 223 | 1 | 0 | 0 | 2 |

TABLE 2-continued ("Series I" Case-system with load on feeders)
Summary Table of Fault Current (shaded blocks) and Current Distribution—
High-Resistance Grounded 480 Volt System;
Ground-Fault at "Far End" of Feeders;
90 kW Ungrounded Balanced Load on All Feeders;
Feeder 4 with 1.0 μF Surge Capacitor Connected on Far End to Ground
(Current in milliamperes as sensed by a core-balance or differential current transformer, unless shown otherwise)

|  | Main | Fdr 1 | Fdr 2 | Fdr 3 | Fdr 4 |
|---|---|---|---|---|---|
| Phase-Ground Fault of Feeder 1 | | | | | |
| Solid ground fault | 1899 | 1911 | 11 | 24 | 303 |
| 700 ohm ground fault | 309 | 313 | 2 | 4 | 50 |
| 46,000 ohm ground fault | 5 | 6 | 0 | 0 | 1 |
| Phase-Ground Fault on Feeder 2 | | | | | |
| Solid Ground fault | 1854 | 6 | 1883 | 23 | 295 |
| 700 ohm ground fault | 302 | 2 | 307 | 3 | 48 |
| 46,000 ohm ground fault | 6 | 0 | 5 | 0 | 1 |
| Phase-Ground Fault on Feeder 3 | | | | | |
| Solid ground fault | 1770 | 6 | 11 | 1793 | 282 |
| 700 ohm ground fault | 288 | 1 | 2 | 293 | 47 |
| 46,000 ohm ground fault | 5 | 0 | 0 | 5 | 1 |
| Phase-Ground Fault on Feeder 4 | | | | | |
| Solid ground fault | 1901 | 6 | 11 | 24 | 1903 |
| 700 ohm ground fault | 308 | 1 | 2 | 4 | 309 |
| 46,000 ohm ground fault | 4 | 0 | 0 | 0 | 5 |

Note: Underlined currents on the non-faulted circuits represent a sensed current at or above a 5 mA protective threshold level.

TABLE 3

("Series I" Case-system with load on feeders)
Summary Table of Fault Current (shaded blocks) and Current Distribution—
Ungrounded 480 Volt System;
Ground-Fault at "Far End" of Feeders;
90 kW Ungrounded Load on All Feeders;
Feeder 4 with 1.0 μF Surge Capacitor Connected on Far End to Ground
(Current in milliamperes as sensed by a core-balance or differential current transformer, unless shown otherwise)

|  | Main | Fdr 1 | Fdr 2 | Fdr 3 | Fdr 4 |
|---|---|---|---|---|---|
| Phase-Ground Fault on Main Bus | | | | | |
| Solid ground fault | 359 | 6 | 11 | 24 | 310 |
| 700 ohm ground fault | 263 | 5 | 8 | 18 | 227 |
| 46,000 ohm ground fault | 6 | 0 | 0 | 0 | 5 |
| Phase-Ground Fault of Feeder 1 | | | | | |
| Solid ground fault | 2 | 345 | 11 | 24 | 204 |
| 700 ohm ground fault | 2 | 253 | 8 | 18 | 223 |
| 46,000 ohm ground fault | 1 | 5 | 0 | 0 | 5 |
| Phase-Ground Fault on Feeder 2 | | | | | |
| Solid Ground fault | 1 | 6 | 332 | 24 | 296 |
| 700 ohm ground fault | 2 | 5 | 243 | 17 | 217 |
| 46,000 ohm ground fault | 1 | 0 | 5 | 0 | 5 |
| Phase-Ground Fault on Feeder 3 | | | | | |
| Solid ground fault | 1 | 5 | 10 | 303 | 283 |
| 700 ohm ground fault | 1 | 4 | 8 | 223 | 206 |
| 46,000 ohm ground fault | 0 | 0 | 0 | 5 | 3 |
| Phase-Ground Fault on Feeder 4 | | | | | |
| Solid ground fault | 1 | 6 | 11 | 24 | 46 |
| 700 ohm ground fault | 0 | 5 | 9 | 17 | 17 |
| 46,000 ohm ground fault | 1 | 0 | 1 | 0 | 5 |

Note: Underlined currents on the non-faulted circuits represent a sensed current at or above a 5 mA protective threshold level.

TABLE 4

("Series II" Case-system with no load on feeders)
Summary Table of Fault Current (shaded blocks) and Current Distribution—
Solidly Grounded 480 Volt System;
Ground-Fault at "Far End" of Feeders;
No Load on All Feeders;
Feeder 4 with 1.0 μF Surge Capacitor Connected on Far End to Ground
(Current in milliamperes as sensed by a core-balance or differential current transformer, unless shown otherwise)

|  | Main | Fdr 1 | Fdr 2 | Fdr 3 | Fdr 4 |
|---|---|---|---|---|---|
| Phase-Ground Fault on Main Bus | | | | | |
| Solid ground fault | 10 kA | 3 | 4 | 9 | 109 |
| 700 ohm ground fault | 396 | 0 | 0 | 0 | 1 |
| 46,000 ohm ground fault | 6 | 1 | 0 | 0 | 1 |
| Phase-Ground Fault of Feeder 1 | | | | | |
| Solid ground fault | 2.4kA | 2.4kA | 1 | 2 | 26 |
| 700 ohm ground fault | 393 | 396 | 0 | 0 | 1 |
| 46,000 ohm ground fault | 6 | 6 | 0 | 0 | 0 |
| Phase-Ground Fault on Feeder 2 | | | | | |
| Solid Ground fault | 1.3kA | 1 | 1.3kA | 1 | 14 |
| 700 ohm ground fault | 396 | 0 | 396 | 0 | 0 |
| 46,000 ohm ground fault | 6 | 0 | 6 | 0 | 1 |

TABLE 4-continued ("Series II" Case-system with no load on feeders)
Summary Table of Fault Current (shaded blocks) and Current Distribution-
Solidly Grounded 480 Volt System;
Ground-Fault at "Far End" of Feeders;
No Load on All Feeders;
Feeder 4 with 1.0 µF Surge Capacitor Connected on Far End to Ground
(Current in milliamperes as sensed by a core-balance or differential current transformer, unless shown otherwise)

|  | Main | Fdr 1 | Fdr 2 | Fdr 3 | Fdr 4 |
|---|---|---|---|---|---|
| Phase-Ground Fault on Feeder 3 | | | | | |
| Solid ground fault | 0.70kA | 1 | 1 | 0.70kA | 8 |
| 700 ohm ground fault | 395 | 0 | 0 | 396 | 0 |
| 46,000 ohm ground fault | 6 | 1 | 0 | 6 | 1 |
| Phase-Ground Fault on Feeder 4 | | | | | |
| Solid ground fault | 2.4kA | 1 | 1 | 2 | 2.4kA |
| 700 ohm ground fault | 396 | 1 | 0 | 0 | 396 |
| 46,000 ohm ground fault | 7 | 1 | 0 | 0 | 6 |

Note: Underlined currents on the non-faulted circuits represent a sensed current at or above a 5 mA protective threshold level.

TABLE 5

("Series II" Case-system with no load on feeders)
Summary Table of Fault Current (shaded blocks) and Current Distribution-
High-Resistance Grounded 480 Volt System;
Ground-Fault at "Far End" of Feeders;
No Load on All Feeders;
Feeder 4 with 1.0 µF Surge Capacitor Connected on Far End to Ground
(Current in milliamperes as sensed by a core-balance or differential current transformer, unless shown otherwise)

|  | Main | Fdr 1 | Fdr 2 | Fdr 3 | Fdr 4 |
|---|---|---|---|---|---|
| Phase-Ground Fault on Main Bus | | | | | |
| Solid ground fault | 2035 | 7 | 12 | 25 | 320 |
| 700 ohm ground fault | 332 | 2 | 2 | 4 | 52 |
| 46,000 ohm ground fault | 4 | 1 | 0 | 0 | 1 |
| Phase-Ground Fault of Feeder 1 | | | | | |
| Solid ground fault | 2001 | 2038 | 12 | 25 | 319 |
| 700 ohm ground fault | 326 | 333 | 2 | 4 | 51 |
| 46,000 ohm ground fault | 7 | 7 | 0 | 0 | 1 |
| Phase-Ground Fault on Feeder 2 | | | | | |
| Solid Ground fault | 2005 | 7 | 2032 | 25 | 319 |
| 700 ohm ground fault | 328 | 2 | 332 | 4 | 52 |
| 46,000 ohm ground fault | 6 | 0 | 6 | 0 | 1 |
| Phase-Ground Fault on Feeder 3 | | | | | |
| Solid ground fault | 2002 | 7 | 12 | 2027 | 319 |
| 700 ohm ground fault | 328 | 2 | 2 | 331 | 52 |
| 46,000 ohm ground fault | 7 | 1 | 0 | 6 | 1 |

TABLE 5-continued ("Series II" Case-system with no load on feeders)
Summary Table of Fault Current (shaded blocks) and Current Distribution-
High-Resistance Grounded 480 Volt System;
Ground-Fault at "Far End" of Feeders;
No Load on All Feeders;
Feeder 4 with 1.0 µF Surge Capacitor Connected on Far End to Ground
(Current in milliamperes as sensed by a core-balance or differential current transformer, unless shown otherwise)

|  | Main | Fdr 1 | Fdr 2 | Fdr 3 | Fdr 4 |
|---|---|---|---|---|---|
| Phase-Ground Fault on Feeder 4 | | | | | |
| Solid grround fault | 2005 | 7 | 12 | 25 | 2005 |
| 700 ohm ground fault | 326 | 1 | 2 | 4 | 327 |
| 46,000 ohm ground fault | 7 | 0 | 0 | 0 | 6 |

Note: Underlined currents on the non-faulted circuits represent a sensed current at or above a 5 mA protective threshold level.

TABLE 6

("Series II" Case-system with no load on feeders)
Summary Table of Fault Current (shaded blocks) and Current Distribution-
Ungrounded 480 Volt System;
Ground-Fault at "Far End" of Feeders;
No Load on All Feeders;
Feeder 4 with 1.0 µF Surge Capacitor Connected on Far End to Ground
(Current in milliamperes as sensed by a core-balance or differential current transformer, unless shown otherwise)

|  | Main | Fdr 1 | Fdr 2 | Fdr 3 | Fdr 4 |
|---|---|---|---|---|---|
| Phase-Ground Fault on Main Bus | | | | | |
| Solid ground fault | 336 | 8 | 12 | 25 | 320 |
| 700 ohm ground fault | 270 | 5 | 9 | 18 | 236 |
| 46,000 ohm ground fault | 6 | 1 | 0 | 1 | 7 |
| Phase-Ground Fault of Feeder 1 | | | | | |
| Solid ground fault | 3 | 302 | 12 | 25 | 320 |
| 700 ohm ground fault | 1 | 265 | 9 | 19 | 234 |
| 46,000 ohm ground fault | 1 | 7 | 0 | 1 | 5 |
| Phase-Ground Fault on Feeder 2 | | | | | |
| Solid Ground fault | 1 | 7 | 354 | 25 | 319 |
| 700 ohm ground fault | 1 | 5 | 261 | 19 | 237 |
| 46,000 ohm ground fault | 1 | 0 | 6 | 1 | 6 |
| Phase-Ground Fault on Feeder 3 | | | | | |
| Solid ground fault | 1 | 7 | 12 | 341 | 320 |
| 700 ohm ground fault | 2 | 5 | 9 | 253 | 237 |
| 46,000 ohm ground fault | 1 | 0 | 0 | 6 | 6 |
| Phase-Ground Fault on Feeder 4 | | | | | |
| Solid grround fault | 1 | 7 | 12 | 25 | 46 |
| 700 ohm ground fault | 1 | 4 | 9 | 19 | 34 |
| 46,000 ohm ground fault | 1 | 0 | 0 | 1 | 1 |

Note: Underlined currents on the non-faulted circuits represent a sensed current at or above a 5 mA protective threshold level.

TABLE 7

("Series III" Case-system with unbalanced phase-neutral load on feeders)
Summary Table of Fault Current (shaded blocks) and Current Distribution-
Solidly Grounded 480 Volt System;
Ground-Fault at "Far End" of Feeders;
Unbalanced Phase-to-Neutral Load on All Feeders;
Feeder 4 Disconnected
(Current in milliamperes as sensed by a core-balance or differential
current transformer enclosing phase and neutral conductors, unless shown
otherwise)

|  | Main | Fdr 1 | Fdr 2 | Fdr 3 | Fdr 4 |
|---|---|---|---|---|---|
| Phase-Ground Fault on Main Bus | | | | | |
| Solid ground fault | *10 kA* | 3 | 4 | 8 | — |
| 700 ohm ground fault | *380* | 0 | 1 | 1 | — |
| 46,000 ohm ground fault | *6* | 0 | 1 | 1 | — |
| Phase-Ground Fault of Feeder 1 | | | | | |
| Solid ground fault | 2.5kA | *2.5 kA* | 1 | 2 | — |
| 700 ohm ground fault | 380 | *378* | 1 | 1 | — |
| 46,000 ohm ground fault | 6 | *6* | 1 | 0 | — |
| Phase-Ground Fault on Feeder 2 | | | | | |
| Solid Ground fault | 1.4kA | 1 | *1.4 kA* | 1 | — |
| 700 ohm ground fault | 387 | 0 | *385* | 0 | — |
| 46,000 ohm ground fault | 7 | 0 | *6* | 0 | — |
| Phase-Ground Fault on Feeder 3 | | | | | |
| Solid ground fault | 0.75kA | 1 | 1 | *0.75 kA* | — |
| 700 ohm ground fault | 369 | 1 | 1 | *366* | — |
| 46,000 ohm ground fault | 7 | 0 | 1 | *6* | — |
| Phase-Ground Fault on Feeder 4 | | | | | |
| Solid ground fault | — | — | — | — | — |
| 700 ohm ground fault | — | — | — | — | — |
| 46,000 ohm ground fault | — | — | — | — | — |

Note: Underlined currents on the non-faulted circuits represent a sensed current at or above a 5 mA protective threshold level.

It is thus clear that the computer simulations validate the concept of the present invention.

It is envisioned that such fault determination can be made within approximately 0.010 second of the fault initiation (i.e., by sensing and determining the peak of all sensor current inputs within +/−0.005 sec of the first peak current that is above the current pickup threshold). Furthermore, electrical isolation (circuit interruption) can be accomplished within 0.025 to 0.050 second of fault initiation for typical low-voltage applications, and within 0.10 second (to allow for the slower operation of normal circuit breakers) for applications of this technology on systems rated above 1000 volts phase-to-phase.

The concept is simple—even though the sensed currents in multiple feeder circuits may be above the 4 to 6 mA trip level, the three-phase feeder circuit that has the current of greatest magnitude is the circuit that has the ground-fault and is the only circuit that needs to be tripped and isolated.

A more comprehensive application of this idea is an interlocked GFCI sensing system that would involve several protection levels within a separately-derived three-phase system. For example, a GFCI system that could be applied on main low-voltage switchgear and downstream panel boards, or motor control centers and still accomplish the discrimination, sensitivity, and speed necessary to prevent electrocution at all levels.

The basic concept implemented by the present invention is the provision of means to (1) continuously monitor the small capacitive currents that flow throughout a three-phase power system during a low-level or high-level ground-fault (i.e., at one extreme, a fault through a person's relatively high body resistance, or at the other extreme, a low-resistance, solid metallic fault from a phase conductor to ground), (2) determine the source of the fault, and (3) simultaneously react to (a) interrupt the faulted source or feeder line, and (b) inhibit the tripping of other non-faulted feeder circuits.

Figure 2:
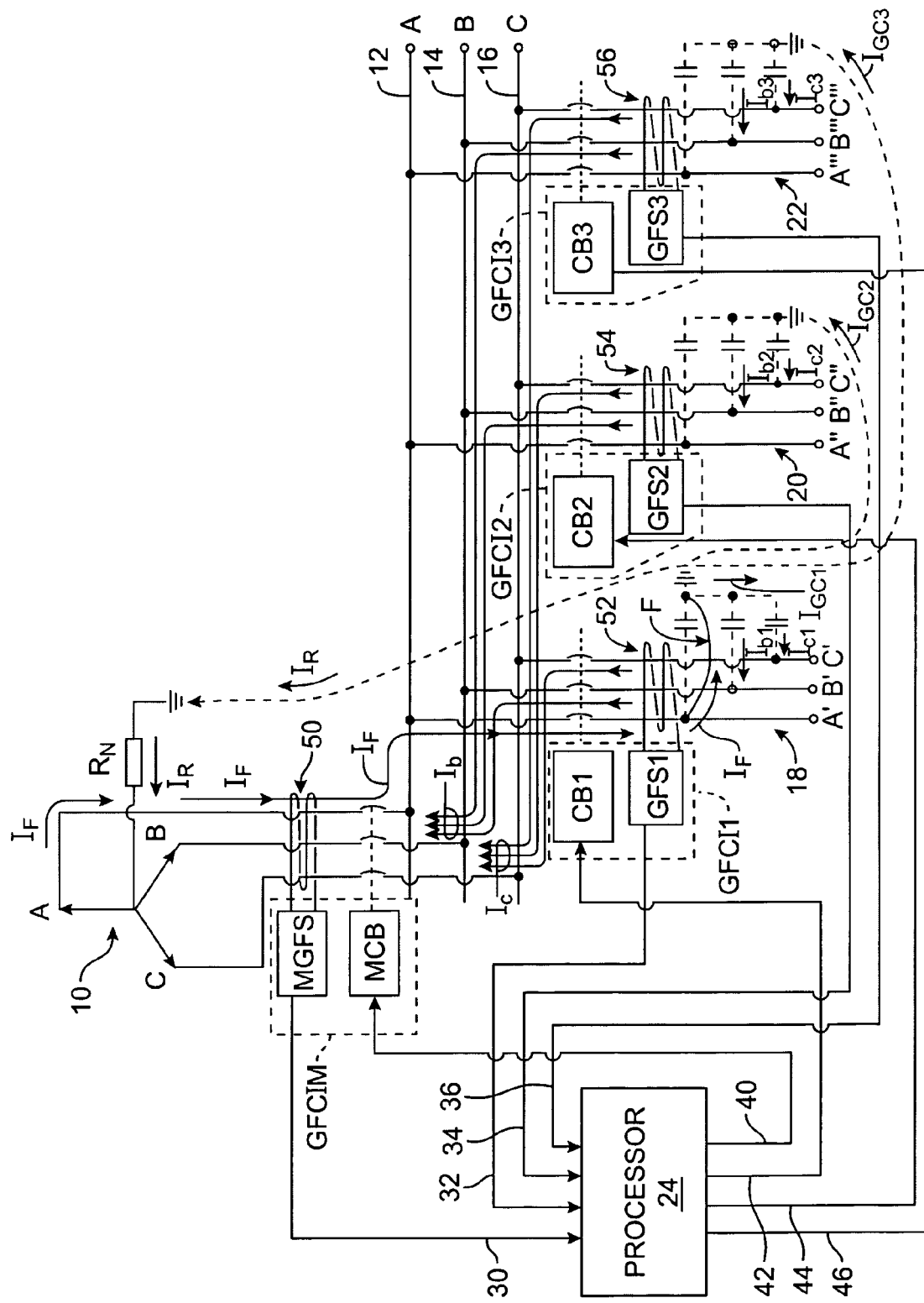
FIG. 2 is a schematic circuit diagram illustrating a three-phase power supply circuit having multiple feeder circuits and a GFCI system in accordance with a preferred embodiment of the present invention.

In FIG. 2 of the drawing, a schematic circuit diagram is shown generally illustrating a three-phase, separately derived power supply circuit 10 coupled (by a main panel or switchable bus, not shown) to three power lines 12, 14, and 16 providing three power phase circuits A, B and C. Connected to the lines 12, 14, and 16 are three feeder circuits shown at 18, 20, and 22, respectively including three power lines A', B' and C'; A", B" and C"; and A'", B'" and C'".

Also depicted in FIG. 2 is a GFCI system in accordance with the present invention. The system includes a GFCI unit designated GFCIM in the main circuit, and units GFCI1, GFCI2 and GFCI3 the feeder circuits 18, 20, and 22, respectively. Each GFCI unit includes a ground-fault sensor (GFS1, GFS2 and GFS3, respectively), as does the main supply (MGFS), and circuit breakers for each feeder circuit (designated CB1, CB2 and CB3, respectively) as well as a main supply breaker MCB.

The system further includes a system processor shown at 24 having inputs 30, 32, 34 and 36, respectively connected to the main sensor MGFS and the feeder sensors GFS1, GFS2, and GFS3 and respectively connected to the main circuit breaker MCB and the several feeder line breakers CB1, CB2 and CB3. These sensor inputs and outputs are wired to, or otherwise connected by means such as fiber-optic communications, etc., into the central processing device 24 which determines the magnitudes of currents (fault signals) detected by the respective sensors, and either actuates or inhibits the associated circuit breakers' trip units. The current magnitudes or fault signals used in the determination can be the peak, average, or root-mean-square measured currents. The fault signals could be digitally processed (or filtered using analog means, such as passive filters) and be represented as a fundamental power-frequency component only (i.e., 60 or 50 Hz) in order to improve discrimination of fault current flow from electrical "noise" or harmonic currents on the power system.

The main circuit breaker MCB and each feeder circuit breaker (CB1, CB2 and CB3) of this separately-derived three-phase system has an associated ground-fault sensor (GFS1, GFS2 and GFS3) implemented as a core balance sensor (current transformer) schematically depicted at 50, 52, 54 and 56 respectively, that encloses the associated three-phase conductors (and neutral conductor, if applicable). Each three-pole feeder circuit breaker includes a shunt-trip device to facilitate rapid tripping of the circuit. The sensors and breakers could be separate or formed as integrated GFCI circuit breaker units.

A periodic "self-test" feature can also be incorporated into the subject GFCI system to assure that the sensing and tripping circuits are always functional. A suitable indicator or an alarm can also be included and initiated when the GFCI system has a defect.

When the threshold trip level is exceeded (4 to 6 mA) in any sensor, the processor 24 determines which GFCI unit has the highest magnitude of sensed current and identifies it as the main or feeder that has the ground-fault and must be tripped (through trip output 40, 42, 44, or 46). The tripping of all other feeders will simultaneously be blocked or inhibited so as to avoid nuisance trips.

Feeders other than a faulted feeder may also have a sensed current of magnitude greater than the threshold trip level due to the capacitive charging current through that particular feeder, but this current can be shown (by the above charts) to always be less in magnitude than the "faulted" feeder. In the case where there is only one GFCI unit exhibiting a sensed current above the threshold, as determined by the processor 24 (as when there is only one feeder in service or there is a very low level, incipient ground-fault), the circuit including that unit will be tripped.

In operation, and referring again to FIG. 2, which illustrates a typical three-phase system with three feeders, each with a GFCI unit including a ground-fault sensor (GFS) that will provide input to the system processor 24 and lead to the trip of the appropriate circuit breaker (CB), should phase A' of feeder 18 suffer a fault "F" from phase A' to ground. The currents flowing in the circuits are as illustrated by $I_F$, $I_R$ and the groups of arrows $I_b$ and $I_c$. The distributed capacitance of the feeder cables is illustrated in dashed lines as three lumped capacitors connected between ground and each phase of each feeder and having currents $I_{GC1}$, $I_{GC2}$ and $I_{GC3}$. The fault signal or current $I_F$ can be expressed in terms of these currents and $I_R$ as $$I_F = I_{GC1} + I_{GC2} + I_{GC3} + I_R.$$

There are basically three different grounding scenarios that will be discussed because the current distribution on the system during each type of ground-fault is slightly different, depending on the method of system grounding, but the current through one feeder is always higher than that through the other feeders during a ground-fault on that one feeder. As will be explained below, incorporating logic in the central processor 24 to inhibit tripping of the other feeders with sensed currents of lower magnitude makes the GFCI system very secure.

"Solidly-Grounded" System

Figure 3A:
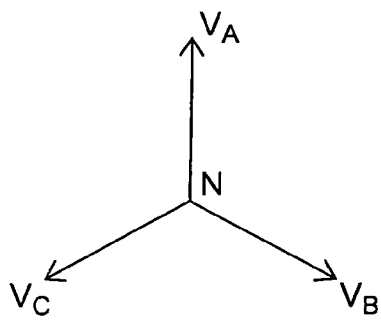
FIGS. 3a-3b are diagrams illustrating the current distributions of a "solidly grounded" system.
Figure 3B:
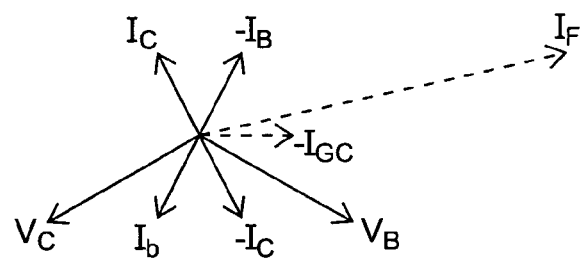

Referring first to FIGS. 3a and 3b, and the confirming simulation charts of Tables 1 and 4, it will be understood that a solid fault "F" from phase A' of feeder 18 (FIG. 2) to ground will result in complete depression of the phase A' to neutral voltage and result in a relatively high fault current $I_F$ (hundreds or thousands of amperes) in phase A' of this feeder, as determined by the system's positive, negative and zero sequence impedances at the point of fault. During the fault $V_A=0$, and the unbalanced voltages that exist with respect to ground force flow in phases B and C of each feeder (see currents $I_b$ and $I_c$ in FIG. 2 and the diagram of FIG. 3b). These two currents add to $I_{GC}$ and could (but for the inhibit function of the present invention) result in a false trip of the non-faulted feeders (20 and 22 in FIG. 2) if the magnitudes of $I_{GC}$ in these feeders exceeds the trip threshold.

If a person's body is inserted between a phase and ground (phase A' of feeder 18 for example), insignificant shift in the neutral voltage will initially occur, the capacitive charging current will remain balanced in all of the feeders, and the feeder currents will initially sum to zero. However, when the current through the body exceeds the pickup level of GFS1, CB1 will be tripped and CB2 and CB3 will be inhibited. And depending on the magnitudes of $I_{GC}$ in the non-faulted feeders (20 and 22 in FIG. 2), but for the present invention, these feeders may have experienced a false trip.

"High-Resistance Grounded" System

Figure 4A:
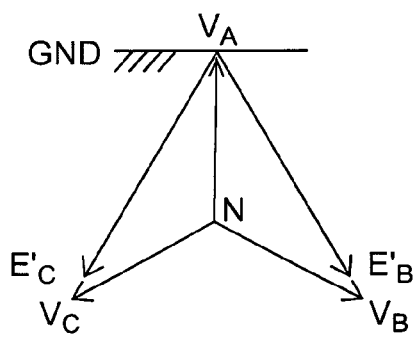
FIGS. 4a-4b are diagrams illustrating the current distributions of a "high-resistance grounded" system.
Figure 4B:
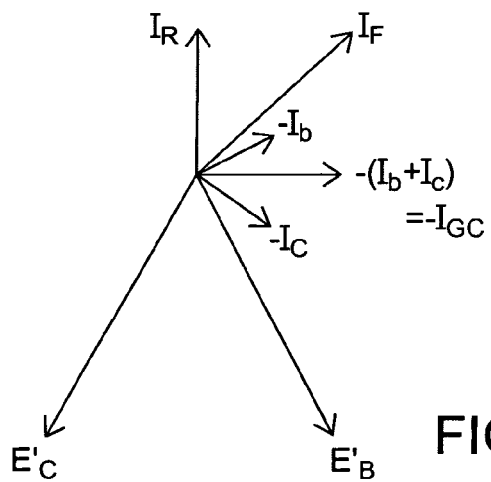

Turning now to FIGS. 4a and 4b, and the confirming simulation charts of Tables 2 and 5. The most severe case for a false trip is when a solid fault occurs from a phase conductor directly to ground, i.e., $V_A$ is set at ground potential by a solid fault from phase A to ground, $$|I_F| = |I_{GC}|$$

$$I_R = V_{AN}/R$$

$$I_F = I_{GC} + I_R = \sqrt{2} I_R$$

And where the resistor, $R_N$, (FIG. 2) is sized so that $I_R$ will equal $I_{GC}$ during the solid fault (this equality of $I_R$ and $I_{GC}$ is chosen to limit the system transient overvoltages during arcing ground-faults). During the fault, the unbalanced voltages that exist with respect to ground force unbalanced currents of the same order of magnitude as the fault signal $I_F$ to flow in phases B and C (see $I_b$ and $I_c$ in the diagram). For this situation, feeders of moderate length (a few hundred feet) could result in a false trip of the non-faulted feeders due to the flow of capacitive charging current. However, the current sensed by GFSI ($I_F - I_{GC1}$) will always be higher than the currents through the GFS units of the other feeders.

Depending on the magnitudes of capacitive charging currents present on a particular system, and the body resistance of a person who contacts the phase conductor, there could be some minor shift in the neutral voltage that might result in unbalanced current through the non-faulted feeders during the human fault contact, but as indicated by Tables 2 and 5 above, the faulted feeder will always experience the highest magnitude of current through its GFS.

"Ungrounded" System

Figure 5A:
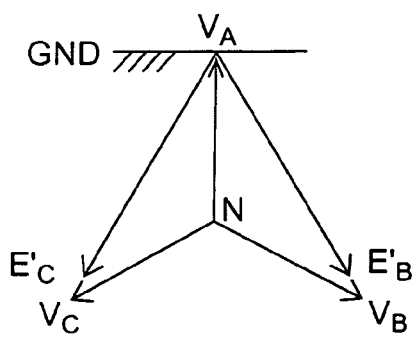
FIGS. 5a-5b are diagrams illustrating the current distributions of an "ungrounded" system.
Figure 5B:
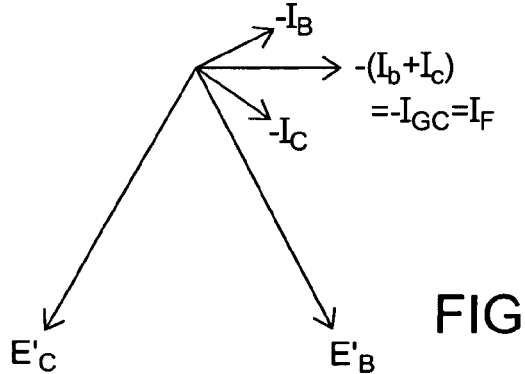

As shown in FIGS. 5a and 5b, and the confirming simulation charts of Tables 3 and 6, the fault current $I_{GC}$ in an ungrounded system is made up entirely of the system charging current, which for many low-voltage systems can be approximately one ampere. The GFS unit of the affected feeder will sense the largest current magnitude ($I_F - I_{GC1}$), with the other GFS units sensing smaller currents in proportion to the distribution of capacitive charging current for those feeders. Note that even though there is no intentional conductive path to ground from an ungrounded system, the capacitive coupling to ground through the cable charging capacitances still make such a system a shock hazard that can result in fatal current flow through a person's body.

As pointed out above, the present invention includes a plurality of GFCI units and a controlling processor forming a ground-fault detecting and circuit interrupting system for use in a three-phase power distribution network including a three-phase source of electrical power, a three- or four-wire main circuit, and a plurality of three- or four-wire feeder circuits. A GFCI unit is provided in the main circuit and in each of the feeder circuits. The processor 24 (FIG. 2) continuously monitors the main GFCI unit and each feeder GFCI unit to determine when and where a fault has occurred, and in response thereto interrupts the faulted circuit and inhibits tripping of the non-faulted circuits.

Figure 6:
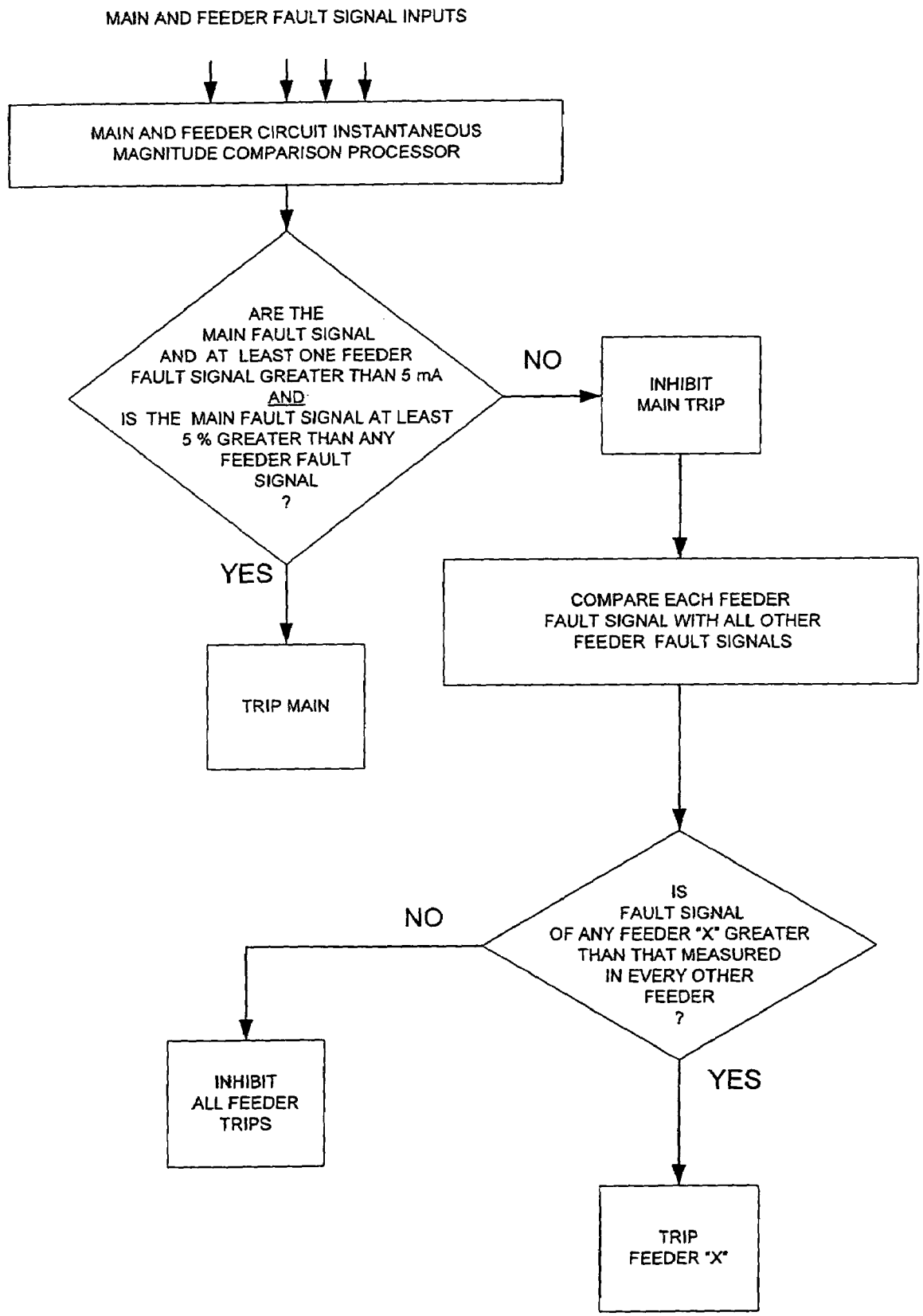
FIG. 6 is a flow chart illustrating operation of the processor of FIG. 2 in the case of an ungrounded power system.
Figure 7:
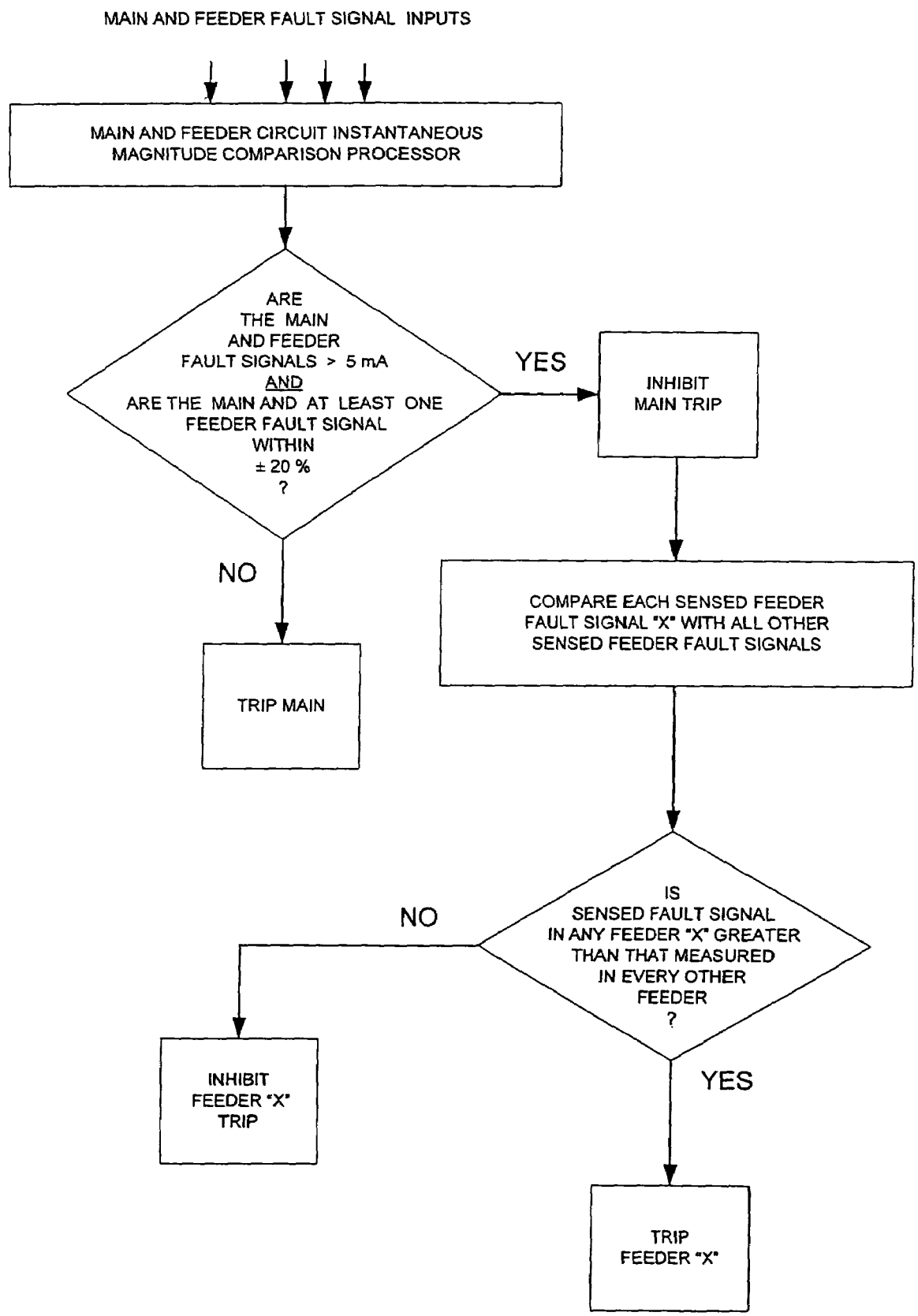
FIG. 7 is a flow chart illustrating operation of the processor of FIG. 2 in the case of a solidly-grounded or high-resistance power system.

Operation of the processor 24 is shown generally by the logic flow charts depicted in FIGS. 6 and 7. As shown in FIG. 2, the processor 24 continuously monitors the current flow condition (the magnitude of the fault signal) sensed by each GFCI unit to detect a fault and makes a comparison of the sensory output (fault signal) of each GFCI unit to the sensory output of each other unit to determine the location of a fault. Once the location of a fault is determined, the faulted feeder circuit is interrupted and all other feeder circuits are inhibited from tripping.

In the case of an ungrounded system, if at any time, current sensed by the main unit and current sensed by at least one feeder unit both exceed a predetermined threshold value (such as 5 mA), and if the current through the main unit is greater than the current through the feeder by a predetermined margin (e.g., 5%), as suggested by the flow diagram of FIG. 6, a determination is made that the fault lies within the main circuit and a "trip" signal is sent to the main GFCI unit to trip the main circuit breaker. This of course disables the entire system.

If on the other hand, the current through the main unit is not within the predetermined margin of the current through the feeder unit, a determination is made that the fault resides outside the main circuit and an "inhibit" signal is sent to the main GFCI unit to inhibit tripping of the main circuit.

As the above test is being made, each feeder unit's fault signal current is also being compared to each other feeder unit's fault signal current, and if it is found that the current through any feeder unit "X" is materially greater than that of the other feeder units, for example, 5%-10% greater, it is determined that the fault resides in the circuit of feeder unit "X", and a trip signal is sent to the GFCI unit of that circuit to trip its breaker. At the same time, inhibit signals are sent to all other feeder units to inhibit their tripping. If on the other hand, no feeder unit's fault signal current is materially greater than any other feeder unit's fault signal current, it is determined that no fault resides among the feeder circuits, and all feeder circuits are inhibited from tripping.

Alternatively stated, in the case of an ungrounded system, if the highest ground-fault current level (by at least a 5% margin), is detected by the sensor in the main circuit, the main switching device is tripped. This condition would mean that the fault to ground is immediately downstream of the main's sensor, such as on a panel's main bus bars, and the main switching device needs to be tripped. If a smaller fault signal current (but still above the 5 mA "trip" threshold) is sensed on any of the feeder circuits compared to what is sensed by the main, and if the sensed fault signal current in the main is not at least 5% greater than that sensed in any feeder circuit, the main switching device is inhibited from a trip.

The 5% margin was chosen as an arbitrary figure where fault signal current levels could be easily discriminated between the main and feeder circuits' sensors, and is based principally upon results for the simulations on the "ungrounded" system. It would apply for a normal configuration and number of feeder circuits. (See Tables 3 and 6).

Ungrounded power systems are not common today, and the complication of the "sensed current magnitude comparisons" between the main and feeders is created by the unique circuit conditions of an ungrounded system. However, the logic works for the general case where the three-phase system is either ungrounded or grounded.

For the solidly-grounded and high-resistance grounded power systems (or for that matter, any impedance-grounded system), as depicted by the flow diagram of FIG. 7, the main's logic simply needs to determine whether or not the ground-fault current or fault signal sensed on any of the feeders is above 5 mA and is close in magnitude (within +/−10% to 20%) to the magnitude of the fault signal current sensed in the main circuit. If so, the main is inhibited from tripping. If not, the main circuit is tripped.

As in the previously described logic, as the above test is being made, each feeder unit's fault signal current is also being compared to each other feeder unit's fault signal current, and if it is found that the current through any feeder unit "X" is materially greater than that of the other feeder units, it is determined that the fault resides in the circuit of feeder unit "X", and a trip signal is sent to the GFCI unit of that circuit to trip its breaker. At the same time, inhibit signals are sent to all other feeder units to inhibit their tripping. If on the other hand, no feeder unit's fault signal current is materially greater than any other feeder unit's fault signal current, it is determined that no fault resides among the feeder circuits, and all feeder circuits are inhibited from tripping.

Figure 8:
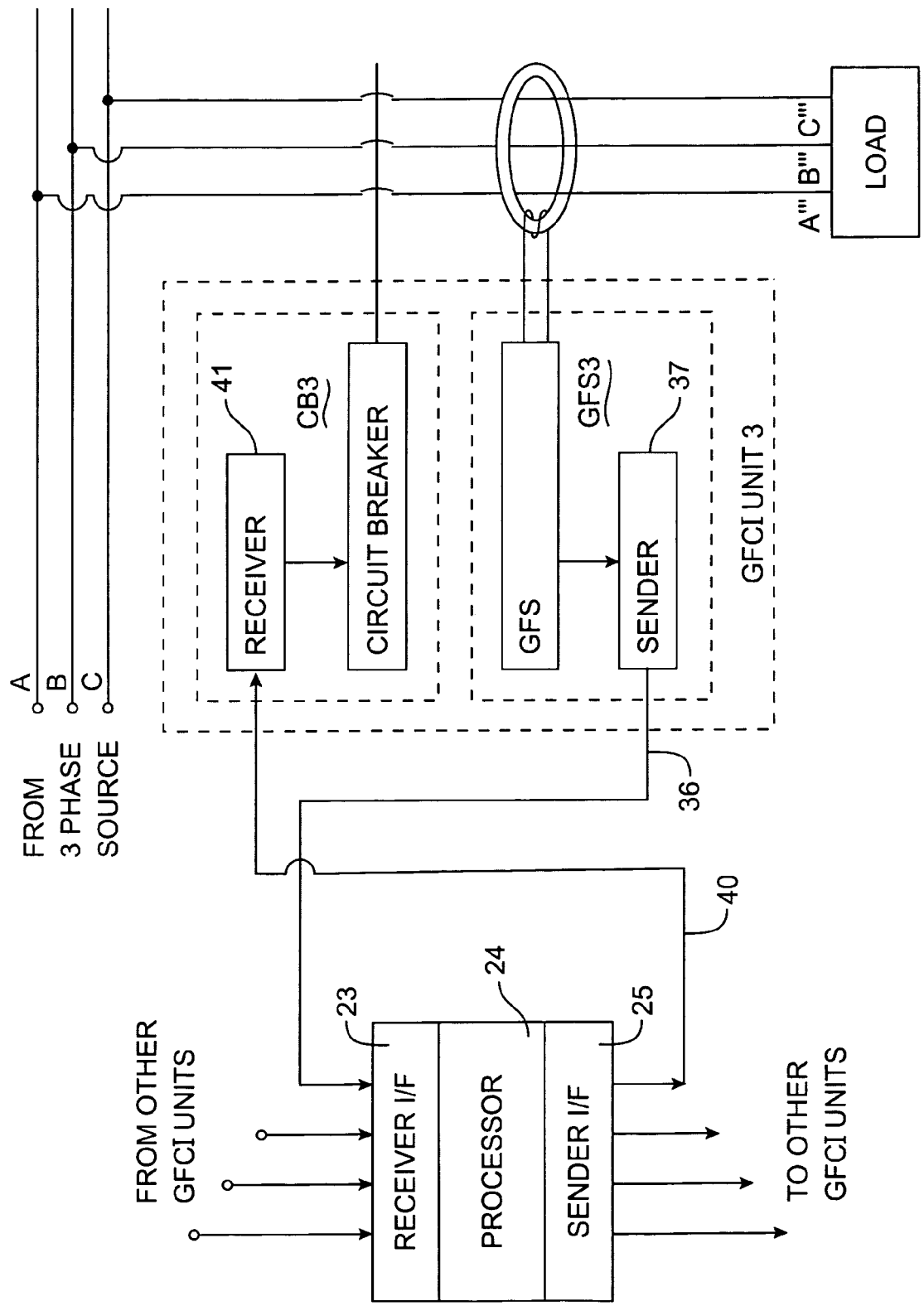
FIG. 8 is a block diagram representation of the fundamental components of one (of multiple) feeder circuit of a GFCI system in accordance with a preferred embodiment of the present invention.

The block diagram of FIG. 8 is a representation of the fundamental components of an exemplary embodiment of the present invention previously shown in a more generalized fashion in FIG. 2 above. In each case, the ground-fault interrupter system is comprised of a processor and assistant interface device together with a number of GFCI Units such as the GFCI Unit 3 device illustrated in FIG. 8. The ground-fault sensor component (GFS3) provides a means to sense the unbalanced ground-fault current that flows in the three (or four) current-carrying feeder conductors A''', B''' and C''' (corresponding to a three- (or four-) wire three-phase system). The GFS could be comprised of a conventional window (or core-balance type) current transformer that supplies an output current in the case of a power system current unbalance, or it could include another type of current-sensing device (e.g., a Hall-effect device) that supplies an output current or voltage signal, representing the instantaneous measured current magnitude from the GFS, in response to an unbalanced current flow in the conductors. This GFS signal is then translated by a "sender" unit 37 to an appropriate current, voltage, or light output that is communicated through an appropriate means of signal transmission (e.g., fiber-optic or metallic conductors 36) to the Processor's "receiver interface" 23. The Processor 24 then executes the necessary logic, described previously, to determine whether to send, or inhibit, a "trip" (or "open") signal to the "circuit breaker" or contactor through the Processor's "sender I/F" 25. The trip or inhibit signal is then translated by the processor "sender I/F" unit 25 to the appropriate current, voltage, or light output through a means of signal transmission (e.g., fiber-optic or metallic conductors 40) to the circuit breaker's "receiver" unit 41.

Any current interrupting device that can interrupt and isolate the three-phase circuit conductors of the supply voltage source could be used as the illustrated "circuit breaker." Current-interrupting devices could include, but are not limited to: air-magnetic or vacuum circuit breakers or motor circuit protectors, air or vacuum contactors, solid-state power switching devices, or electronically triggered fuses.

The signal to the circuit breaker's receiver 41 could be used to actuate a trip coil or a stored-energy trip-release mechanism, the interruption of current to a hold-in coil (e.g., as used for a contactor), or could be in the form of a current or voltage to initiate or stop the conduction of power semiconductor devices, or a current or voltage output to electronically trigger fuses. Although not shown, the power to supply any of the devices shown in FIG. 8 could be derived from an external power source or stored-energy supply (battery or capacitor), the voltage of the monitored power system itself, or energy derived from load current flow through the power system.

Although the present invention has been described above in terms of particular embodiments illustrated in the several figures of the drawing, it will be appreciated that other configurations of components and processing software may be utilized without departing from the spirit of the present invention. For example, any suitable form of GFCI unit capable of monitoring and reporting out current flow, and responding to control inputs to inhibit and/or interrupt a circuit may be used.

Furthermore, the techniques of the present invention may be applied to other fault detecting schemes such as the Residual Current Devices (RCD) employed outside of North America. Such devices usually have a somewhat higher nominal pickup sensitivity of 30 mA but are likewise intended to prevent ventricular fibrillation from an electrical shock. Although the RCD is not as susceptible to nuisance trips (from the individual feeder capacitive charging currents) due to its less sensitive pickup characteristics, it will be apparent that the usefulness of the present invention also applies to the RCD.

Moreover, although as yet unconfirmed, the present invention may be useful at higher voltages of say 720 volts, for example, and possibly even up to 1000 volts and beyond. But there may be a practical upper limit of application of the present invention for "unprotected" personnel (i.e., personnel without shock protection equipment, such as insulating rubber gloves and the like). The maximum current through the body, as calculated above, could also be higher for wet conditions. And above 1000 volts, other means might need be employed to reduce the current though the body to within human tolerance (e.g., use of insulating barriers such as mat, gloves, footwear, etc.), but the sensitive GFCI sensing technology of the present invention could still be used.

Notwithstanding that the present invention has been described above in terms of alternative embodiments, it is anticipated that still other alterations, modifications and applications will become apparent to those skilled in the art after having read this disclosure. It is therefore intended that such disclosure be considered illustrative and not limiting, and that the appended claims be interpreted to include all such applications, alterations, modifications and embodiments as fall within the true spirit and scope of the invention.

The invention claimed is:

1. A ground-fault circuit-interrupter (GFCI) system for a separately derived three-phase electrical power supply system including a three-phase power supply and main bus circuit with a plurality of feeder circuits connected to the main bus circuit, comprising:
a plurality of GFCI units respectively associated with said main bus and one of said feeder circuits and operative to monitor the capacitive charging currents or the fault current to ground flowing therethrough and to generate a fault signal commensurate with the degree of unbalance of the currents flowing through the several conductors of each said circuit; and
a processor for continuously monitoring the fault signals generated by the GCFI unit on the main bus circuit and the GCFI unit on each feeder circuit connected to the main bus circuit, said processor being programmed
to determine when a fault condition exists based on certain predetermined relationships between and among the fault signal generated by the GFCI unit in the main bus circuit and the fault signals generated by the GFCI units in the feeder circuits,
to determine which circuit is experiencing a fault,
to generate and transmit a trip signal to the GFCI unit in the faulted circuit causing that circuit to be interrupted, and
to generate and transmit an inhibit signal to at least some of the other circuits causing those circuits to be inhibited from interruption.

2. A ground-fault circuit-interrupter (GFCI) system as recited in claim 1 wherein said processor is programmed to determine that a fault condition exists in the main bus circuit
if the fault signal from the GFCI unit in the main bus circuit and the fault signal from the GFCI unit in at least one feeder circuit are greater in magnitude than a predetermined threshold value, and
if the fault signal from the GFCI unit in the main circuit is at least a predetermined percentage greater than a fault signal from a GFCI unit in any of said feeder circuits.

3. A ground-fault circuit-interrupter (GFCI) system as recited in claim 2 wherein said processor is further programmed to determine that a fault condition exists in one of the feeder circuits,
if no fault condition exists in the main circuit, and
if the fault signal generated by the GFCI unit in any feeder circuit is materially greater than the fault signals generated by the GFCI units in the other feeder circuits.

4. A ground-fault circuit-interrupter (GFCI) system as recited in claim 3 wherein said processor is further programmed to determine that no fault condition exists in any of the feeder circuits,
if no fault condition exists in the main circuit, and
if the fault signal generated by the GFCI unit in any feeder circuit is not materially greater than the fault signals generated by the GFCI units in the other feeder circuits.

5. A ground-fault circuit-interrupter (GFCI) system as recited in claim 1 and further comprising:
transmission means for communicating the fault signals, and the trip and inhibit signals between said GFCI units and said processor; and
wherein each said GFCI unit includes
a ground-fault sensor (GFS) unit coupled to the current carrying conductors of a corresponding main or feeder circuit and operative to develop a fault signal corresponding to any unbalanced current flow therein; and
a circuit breaker responsive to the trip and inhibit signals for interrupting or inhibiting interruption of the corresponding main or feeder circuit.

6. A ground-fault circuit-interrupter (GFCI) system as recited in claim 5 wherein each said GFCI unit further includes
a first sender for interfacing with the GFS unit thereof to translate the fault signal developed thereby to a form suitable for communication over said transmission means to said processor; and
a first receiver for receiving translated trip and inhibit signals communicated over said transmission means from the processor to the GFCI unit, and for converting the translated trip and inhibit signals to a form suitable for interfacing with the circuit breaker thereof; and
wherein said processor includes
a second receiver for receiving the translated fault signals and converting them to a form suitable for interfacing with the processor; and
a second sender for interfacing with the processor to translate trip and inhibit signals developed by said processor to a form suitable for communication over said transmission means to said first receiver.

7. A ground-fault circuit-interrupter (GFCI) system as recited in claim 1 wherein said processor is programmed to determine that a fault condition exists in the main circuit
if the fault signal generated by the GFCI unit in the main circuit and the fault signals generated by the GFCI units in the feeder circuits are not of magnitudes greater than a predetermined threshold value, or if the fault signal generated by the GFCI unit in the main circuit and the fault signals generated by the GFCI unit in at least one feeder circuit do not have magnitudes within a predetermined percentage of each other.

8. A ground-fault circuit-interrupter (GFCI) system as recited in claim 7 wherein said processor is further programmed to determine that no fault condition exists in any of the feeder circuits
if no fault condition exists in the main circuit and
if the fault signal generated by the GFCI unit in any feeder circuit is not materially greater than the fault signal generated by the GFCI units in the other feeder circuits.

9. A ground-fault circuit-interrupter (GFCI) system as recited in claim 8 wherein said processor is further programmed to determine that a fault condition exists in at least one of the feeder circuits
if no fault condition exists in the main circuit and
if a fault signal generated by the GFCI unit in any feeder circuit is materially greater than the fault signal generated by a GFCI unit in the other feeder circuits.

10. A method of providing ground-fault circuit interruption for a separately derived three-phase electrical power supply system including a three-phase power supply and main bus circuit with a plurality of feeder circuits connected to the main bus circuit, and a plurality of ground-fault circuit interruptor (GFCI) units respectively and operatively associated with the main bus and each of the feeder circuits and operative to generate a fault signal commensurate with the degree of current unbalance among the several conductors of the associated circuit and to appropriately respond to a trip signal and an inhibit signal, comprising the steps of:
monitoring the fault signals generated by the several GFCI units;
determining when a fault condition exists based on certain predetermined relationships between and among the fault signal generated by the GFCI unit in the main bus circuit and the fault signals generated by the GFCI units in the feeder circuits;
determining which of the several circuits is experiencing a fault;
generating and transmitting a trip signal to the GFCI unit in the faulted circuit thereby causing that circuit to be interrupted; and
generating and transmitting an inhibit signal to the GFCI units of at least some of the other circuits thereby causing those circuits to be inhibited from interruption.

11. A method of providing ground-fault circuit interruption as recited in claim 10 and further comprising:
determining that no fault condition exists in the main circuit
if the fault signal from the GFCI unit in the main circuit and the fault signal from the GFCI unit in at least one feeder circuit are greater in magnitude than a predetermined threshold value, and
if the fault signal from the GFCI unit in the main circuit is at least a predetermined percentage greater than a fault signal from a GFCI unit in any of said feeder circuits.

12. A method of providing ground-fault circuit interruption as recited in claim 11 and further comprising:
determining that a fault condition exists in one of the feeder circuits
if no fault condition exists in the main circuit, and
if the fault signal generated by the GFCI unit in any feeder circuit is materially greater than the fault signals generated by the GFCI units in every other feeder circuit.

13. A method of providing ground-fault circuit interruption as recited in claim 12 and further comprising:
determining that no fault condition exists in any of the feeder circuits
if no fault condition exists in the main circuit, and
if no fault signal generated by any GFCI unit in any feeder circuit is materially greater than the fault signals generated by the GFCI units in every other feeder circuit.

14. A method of providing ground-fault circuit interruption as recited in claim 10 and further comprising:
determining that no fault condition exists in the main circuit
if the fault signal generated by the GFCI unit in the main circuit and a fault signal generated by at least one of the GFCI units in the feeder circuits are not of magnitudes greater than a predetermined threshold value, or
if the fault signal generated by the GFCI unit in the main circuit and the fault signal generated by the GFCI unit in at least one feeder circuit do not have magnitudes within a predetermined percentage of each other.

15. A method of providing ground-fault circuit interruption as recited in claim 14 wherein said processor is programmed to determine that no fault condition exists in any of the feeder circuits
if no fault condition exists in the main circuit, and
if the fault signal generated by the GFCI unit in any feeder circuit is not materially greater than the fault signal generated by the GFCI units in the other feeder circuits.

16. In a three-phase electrical power supply system including a three-phase power supply and main bus circuit with a plurality of feeder circuits connected to the main bus circuit and a ground-fault protective system for protecting against accidental faults to ground, an improved ground-fault protective system comprising:
a plurality of ground-fault circuit-interrupter (GFCI) units each of which is associated with either said main bus circuit or one of said feeder circuits and is operative to monitor the capacitive charging currents flowing therethrough and to generate a fault signal of magnitude commensurate with the degree of unbalance of the currents flowing through the several conductors of an associated circuit; and
a processor communicatively coupled to and operative to continuously monitor the fault signals generated by the GCFI unit on the main bus circuit and the GCFI unit on each feeder circuit, said processor being programmed
to determine when a fault condition exists based on certain predetermined relationships between and among the fault signals generated by the GFCI unit in the main bus circuit and the fault signals generated by the GFCI units in the feeder circuits,
to determine which of said circuits is experiencing a fault,
to generate and transmit a trip signal to the GFCI unit in the faulted circuit thereby causing that circuit to be interrupted, and
to generate and transmit an inhibit signal to at least some of the other circuits thereby causing those circuits to be inhibited from interruption.

17. In a three-phase electrical power supply system as recited in claim 16 wherein said processor has the capability of
   determining that no fault condition exists in the main circuit
      if the fault signal from the GFCI unit in the main circuit and the fault signal from the GFCI unit in at least one feeder circuit are greater in magnitude than a predetermined threshold value, and
      if the fault signal from the GFCI unit in the main circuit is at least a predetermined percentage greater than a fault signal from a GFCI unit in any of said feeder circuits.

18. In a three-phase electrical power supply system as recited in claim 17 wherein said processor has the further capability of
   determining that no fault condition exists in any of the feeder circuits
      if no fault condition exists in the main circuit, and
      if the fault signal generated by the GFCI unit in any feeder circuit is not materially greater than the fault signal generated by a GFCI unit in the other feeder circuits.

19. In a three-phase electrical power supply system as recited in claim 18 wherein said processor has the further capability of
   determining that a fault condition exists in one of the feeder circuits
      if no fault condition exists in the main circuit, and
      if the fault signal generated by the GFCI unit in any feeder circuit is materially greater than the fault signal generated by a GFCI unit in one of the other feeder circuits.

20. In a three-phase electrical power supply system as recited in claim 16 wherein said processor has the capability of
   determining that no fault condition exists in the main circuit
      if the fault signal from the GFCI unit in the main circuit and the fault signal from the GFCI unit in at least one feeder circuit are not of magnitudes greater than a predetermined threshold value, or
      if the fault signal from the GFCI unit in the main circuit and at least one fault signal from at least one feeder circuit are not within a predetermined percentage of each other.

21. In a three-phase electrical power supply system as recited in claim 20 wherein said processor has the further capability of
   determining that no fault condition exists in any of the feeder circuits
      if no fault condition exists in the main circuit, and
      if the fault signal generated by the GFCI unit in any feeder circuit is not materially greater than the fault signal generated by a GFCI unit in the other feeder circuits.

22. In a three-phase electrical power supply system as recited in claim 21 wherein said processor has the further capability of
   determining that a fault condition exists in one of the feeder circuits
      if no fault condition exists in the main circuit, and
      if the fault signal generated by the GFCI unit in any feeder circuit is materially greater than the fault signal generated by a GFCI unit in one of the other feeder circuits.

23. In a three-phase electrical power supply system as recited in claim 16 wherein said improved ground-fault protective system further comprises:
   transmission means for communicating the fault signals, and the trip and inhibit signals between said GFCI units and said processor; and
   wherein each said GFCI unit includes
   a ground-fault sensor (GFS) unit coupled to the current carrying conductors of a corresponding main or feeder circuit and operative to develop a fault signal corresponding to any unbalanced current flow therein; and
   a circuit breaker responsive to the trip and inhibit signals for interrupting or inhibiting interruption of the corresponding main or feeder circuit.

24. In a three-phase electrical power supply system as recited in claim 23 wherein each said GFCI unit further includes
   a first sender for interfacing with the GFS unit thereof to translate the fault signal developed thereby to a form suitable for communication over said transmission means to said processor; and
   a first receiver for receiving translated trip and inhibit signals communicated over said transmission means from the processor to the GFCI unit, and for converting the translated trip and inhibit signals to a form suitable for interfacing with the circuit breaker thereof; and
   wherein said processor includes
   a second receiver for receiving the translated fault signals and converting them to a form suitable for interfacing with the processor; and
   a second sender for interfacing with the processor to translate trip and inhibit signals developed by said processor to a form suitable for communication over said transmission means to said first receiver.

* * * * *